（12）United States Patent
Zhong et al.

(10) Patent No.: US 10,084,390 B2
(45) Date of Patent: Sep. 25, 2018

(54) POWER CONVERTER, SHORT CIRCUIT PROTECTION CIRCUIT, AND CONTROL METHOD

(71) Applicant: Delta Electronics (Shanghai) Co., Ltd., Shanghai (CN)

(72) Inventors: Qing-Long Zhong, Shanghai (CN); Yan Li, Shanghai (CN); Hong-Jian Gan, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 545 days.

(21) Appl. No.: 14/727,836

(22) Filed: Jun. 1, 2015

(65) Prior Publication Data

US 2015/0380926 A1    Dec. 31, 2015

(30) Foreign Application Priority Data

Jun. 25, 2014 (CN) .......................... 2014 1 0293338

(51) Int. Cl.

| H02H 3/08 | (2006.01) |
|---|---|
| H02M 7/44 | (2006.01) |
| H02M 1/32 | (2007.01) |
| H03K 17/082 | (2006.01) |
| H03K 17/691 | (2006.01) |
| H02M 7/5387 | (2007.01) |

(52) U.S. Cl.
CPC .............. *H02M 7/44* (2013.01); *H02M 1/32* (2013.01); *H03K 17/0828* (2013.01); *H03K 17/691* (2013.01); *H02M 7/5387* (2013.01)

(58) Field of Classification Search
CPC .............. H02M 1/32; H02H 3/08; H02H 3/20

USPC .......................................................... 361/18
See application file for complete search history.

(56) References Cited

U.S. PATENT DOCUMENTS

| 7,135,845 B2 | 11/2006 | Zverev et al. |
|---|---|---|
| 7,443,641 B2 | 10/2008 | Suzuki |
| 7,760,478 B2 | 7/2010 | Yang et al. |
| 2010/0277143 A1 | 11/2010 | Kudo et al. |

(Continued)

FOREIGN PATENT DOCUMENTS

| CN | 101471561 A | 7/2009 |
|---|---|---|
| CN | 202026077 U | 11/2011 |
| CN | 102427219 A | 4/2012 |

(Continued)

*Primary Examiner* — Dharti Patel
(74) *Attorney, Agent, or Firm* — CKC & Partners Co., Ltd.

(57) ABSTRACT

A power converter, short circuit protection circuit, and control method are disclosed herein. The power converter is configured to generate an output voltage and includes a semiconductor switch, a short circuit protection circuit, and a signal processing module. The semiconductor switch is configured to adjust the output voltage according to a driving signal. The short circuit protection circuit is configured to generate a short circuit protecting signal according to a control signal and a short circuit status of the semiconductor switch. The signal processing module is configured to generate the control signal and the driving signal according to a modulating signal, and to turn off the semiconductor switch according to the short circuit protecting signal. A delay duration is present between the modulating signal and the control signal, and the semiconductor switch is turned on during the delay duration.

42 Claims, 8 Drawing Sheets

(56) References Cited

U.S. PATENT DOCUMENTS

2013/0083576 A1* 4/2013 Gan .................... H02M 1/088
362/123

FOREIGN PATENT DOCUMENTS

| CN | 102738772 A | 10/2012 |
|---|---|---|
| CN | 103036415 A | 4/2013 |
| EP | 1619782 A2 | 1/2006 |

* cited by examiner

100

PWM

POWER CONVERTER, SHORT CIRCUIT PROTECTION CIRCUIT, AND CONTROL METHOD

RELATED APPLICATIONS

This application claims priority to China Application Serial Number 201410293338.0, filed Jun. 25, 2014, which is herein incorporated by reference.

BACKGROUND

Technical Field

The present disclosure relates to a power converter. More particularly, the present disclosure relates to a power converter capable of protecting against a short circuit.

Description of Related Art

In the applications of high-power converters, such as high-voltage converters, solar inverters, semiconductor switch is usually utilized to adjust the voltage and frequency of power converters. If the power converter operates in an abnormal condition, such as a short circuit, the semiconductor switch is usually affected. As a result, the operations of the power converter are failed.

One of common semiconductor switch is insulated gate bipolar transistor (IGBT). FIG. 1A depicts a schematic diagram of an IGBT 100. FIG. 1B depicts a schematic diagram of a waveform of the IGBT in FIG. 1A when it works in short circuit condition.

As shown in FIG. 1A, IGBT 100 has a gate (G), a collector (C), and an emitter (E).

As shown in FIG. 1B, one situation is that the circuit where IGBT 100 of a power converter works in pre-short circuit condition (that is, waveform 101). Another situation is that the circuit works in short circuit condition (that is, waveform 102) when IGBT 100 is turned on. As shown in FIG. 1B, when a short circuit occurs, the current $I_{IGBT}$ of IGBT 100 is substantially increased and the voltage VCE between the collector (C) and the emitter (E) also rises. At this time, the IGBT 100 is required to sustain a higher power, it will possibly shorten the lifetime or degrade the performance of IGBT 100. As a result, the reliability of the power converter is reduced.

For the forgoing reasons, there is a need for solving the above problems of short circuit protection in power converter using semiconductor switch, which is one of the important research subjects and an objective that the industry endeavor to improve.

SUMMARY

One aspect of this disclosure is to provide a power converter. The power converter is configured to generate an output voltage. The power converter comprises a semiconductor switch, a short circuit protection circuit, and a signal processing module. The semiconductor switch is configured to adjust the output voltage according to a driving signal. The short circuit protection circuit is configured to generate a short circuit protection signal according to a control signal and a short circuit status of the semiconductor switch. The signal processing module is electrically coupled to the semiconductor switch and the short circuit protection circuit and configured to generate the control signal and the driving signal according to a modulating signal and turn off the semiconductor switch according to the short circuit protection signal. A delay duration is present between the modulating signal and the control signal, and the semiconductor switch is turned on during the delay duration.

Another one aspect of this disclosure is to provide a short circuit protection circuit. The short circuit protection circuit is configured to generate a short circuit protection signal so as to turn off an insulated gate bipolar transistor when the insulated gate bipolar transistor works in a short circuit condition. The insulated gate bipolar transistor is driven by a driving signal generated by a signal processing module. The short circuit protection circuit comprises a comparator and a switch. The comparator is electrically coupled to the insulated gate bipolar transistor configured to receive a detecting voltage and compare the detecting voltage with a reference voltage to generate the short circuit protection signal when the detecting voltage is higher than the reference voltage. The switch is electrically coupled to the comparator and the insulated gate bipolar transistor and configured to receive a control signal and to be turned off according to the control signal to allow the comparator to receive the detecting voltage. The signal processing module generates the control signal and the driving signal according to a modulating signal. The signal processing module turns off the insulated gate bipolar transistor according to the short circuit protection signal, and a delay duration is configured to be present between the modulating signal and the control signal, and the delay duration is a time interval between a time at a rising edge of the modulating signal and a time at a falling edge of the control signal.

Yet another aspect of the disclosure is to provide a control method adapted for an insulated gate bipolar transistor. The insulated gate bipolar transistor is turned on or turned off according to a driving signal. The control method comprises the following steps: turning on a switch by a control signal when the insulated gate bipolar transistor is turned off, the switch being electrically coupled to a comparator and the comparator being electrically coupled to a collector of the insulated gate bipolar transistor; generating the control signal and the driving signal according to a modulating signal by a signal processing module, in which a delay duration is configured to be present between the modulating signal and the control signal, and the delay duration is a time interval between a time at a rising edge of the modulating signal and a time at a falling edge of the control signal; turning off the switch after the delay duration to allow the comparator to receive a detecting voltage when the insulated gate bipolar transistor is turned on; and generating a short circuit protection signal to the signal processing module to turn off the insulated gate bipolar transistor when the detecting voltage is higher than a reference voltage.

In summary, the disclosure perform the short circuit protection by detecting voltage between a collector and a emitter of the IGBT when the IGBT is turned on, and setting a delay duration between the modulating signal and the control signal. It can decrease the time for the semiconductor switch sustains high current and the high voltage during the short circuit condition. As a result, the reliabilities of the power converter and the semiconductor switch are improved.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1A:
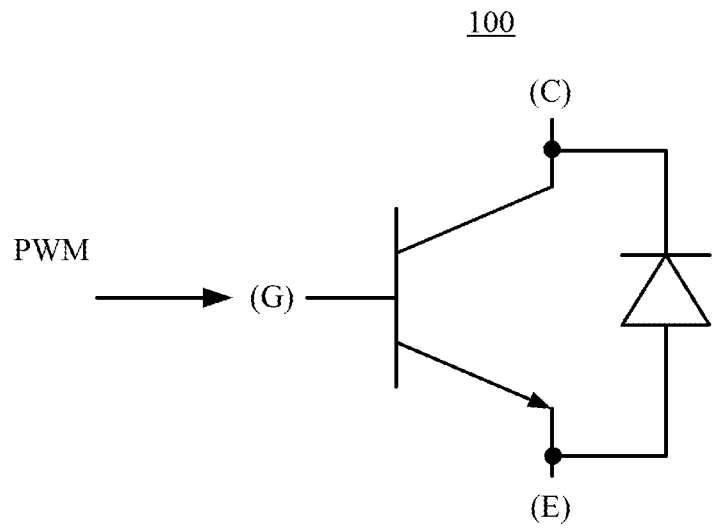
FIG. 1A depicts a schematic diagram of an insulated gate bipolar transistor.
Figure 1B:
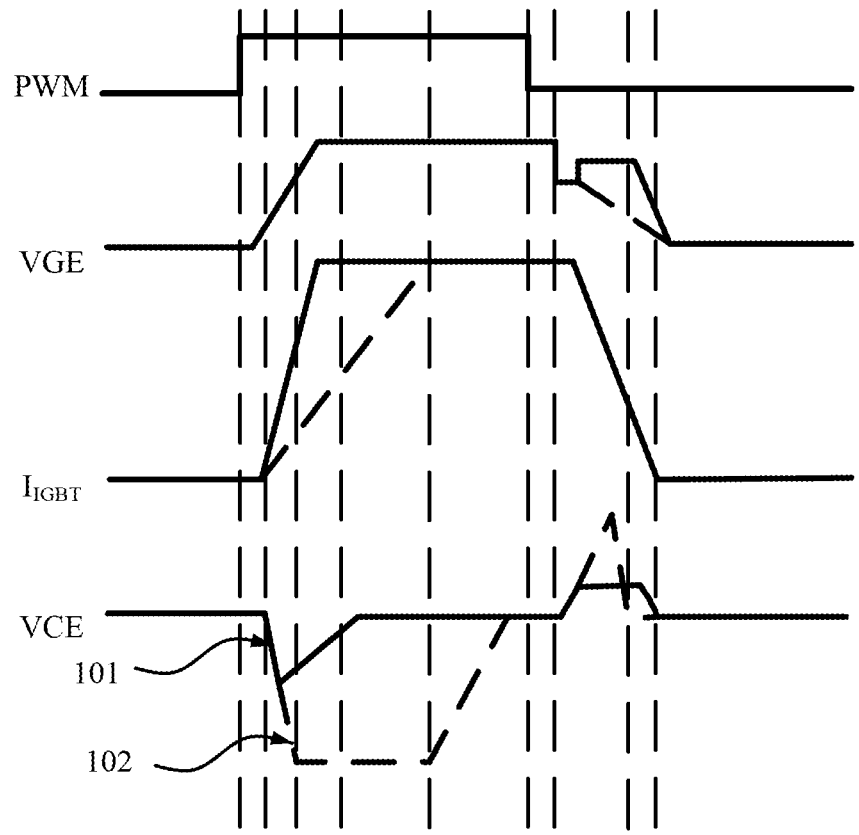
FIG. 1B depicts a schematic diagram of a waveform of the insulated gate bipolar transistor in FIG. 1A when it works in a short circuit condition.

Reference will now be made in detail to the present embodiments of the disclosure, examples of which are illustrated in the accompanying drawings. However, the embodiments provided herein are intended as illustrative only since numerous modifications and variations therein will be apparent to those skilled in the art. Description of the operation does not intend to limit the operation sequence. Any structures resulting from recombination of devices with equivalent effects are within the scope of the present disclosure. In addition, drawings are only for the purpose of illustration and not plotted according to the original size. Wherever possible, the same reference numbers are used in the drawings and the description to refer to the same or like parts.

Reference will now be made in detail to the present embodiments of the invention, examples of which are illustrated in the accompanying drawings. Wherever possible, the same reference numbers are used in the drawings and the description to refer to the same or like parts.

As used herein, "around," "about" or "approximately" shall generally mean within 20 percent, preferably within 10 percent, and more preferably within 5 percent of a given value or range. Numerical quantities given herein are approximate, meaning that the term "around," "about" or "approximately" can be inferred if not expressly stated.

Although the terms "first," "second," etc., may be used herein to describe various elements, these elements should not be limited by these terms. These terms are used to distinguish one element from another.

In this document, the term "coupled" may also be termed as "electrically coupled", and the term "connected" may be termed as "electrically connected". "Coupled" and "connected" may also be used to indicate that two or more elements cooperate or interact with each other.

Figure 2:
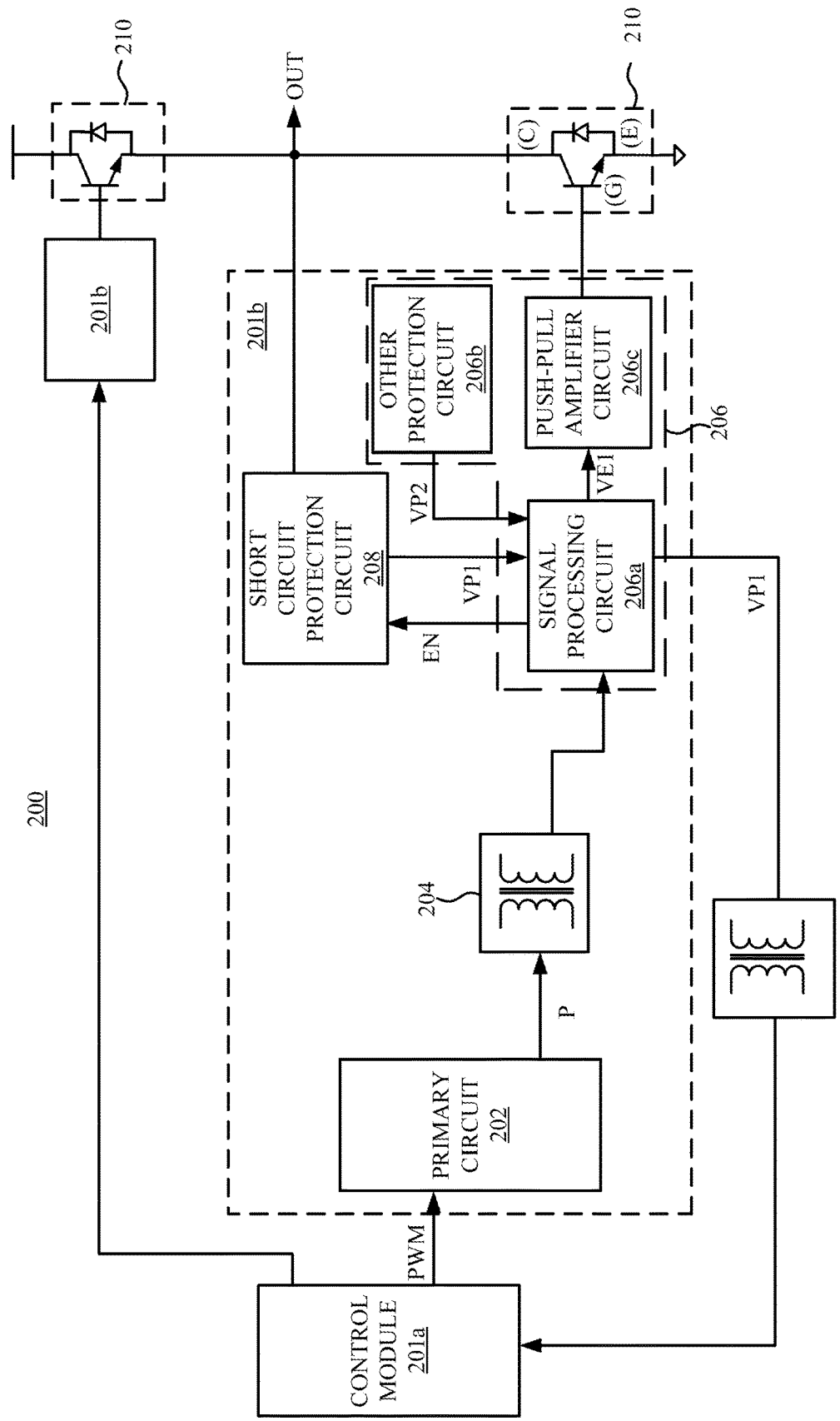
FIG. 2 depicts a schematic diagram of a power converter according to one embodiment of this disclosure.

FIG. 2 depicts a schematic diagram of a power converter 200 according to one embodiment of this disclosure. As shown in FIG. 2, the power converter 200 includes a control module 201a, drivers 201b, and semiconductor switches 210. The control module 201a controls the drivers 201b individually. In various embodiments, the control module 201a includes a processor or a control chip. The semiconductor switches 210 are coupled in series and are driven by the drivers 201b correspondingly so as to generate an output voltage OUT. The driver 201b includes a primary circuit 202, a transformer 204, a signal processing module 206, and a short circuit protection circuit 208. In various embodiments, the semiconductor switch 210 includes a full-controlled semiconductor switching device, such as an insulated gate bipolar transistor (IGBT), a metal-oxide-semiconductor field effect transistor (MOSFET), an integrated gate-commutated thyristor (IGCT).

The primary circuit 202 is configured to receive a modulating signal PWM outputted by the control module 201a and generate a pulse signals P according to the modulating signal. The modulating signal PWM is a logic level signal having a high voltage level or a low voltage level, and pulse signals P include an ON pulse signal and an OFF pulse signal. In some embodiments, a width of the ON pulse signal and a width of the OFF pulse signal may respectively be any value between 50 nanoseconds (ns) and 10 microseconds (μs). The ON pulse signal corresponds to a rising edge of the modulating signal PWM. The OFF pulse signal corresponds to a falling edge of the modulating signal PWM. The transformer 204 is configured to input the pulse signal P to the signal processing module 206. In some embodiments, the above modulating signal PWM may be a pulse-width modulation (PWM) signal. The signal processing module 206 is electrically coupled to a control terminal (such as a gate (G)) of the semiconductor switch 210. The signal processing module 206 is configured to receive the pulse signal P generated by the primary circuit 202 and generate a control signal EN to the short circuit protection circuit 208 and generate a driving signal VE1 to selectively turn on or turn off the semiconductor switch 210 according to the pulse signal P, so as to adjust the output voltage OUT (e.g., adjust the DC voltage outputted by the power converter 200). It is noted that the pulse signal P is generated according to the modulating signal PWM. Hence, there is a certain connection between the pulse signal P and the modulating signal PWM. For example, the driving signal VE1 generated by the signal processing module 206 according to the pulse signal P may have the same phase as the modulating signal PWM. That is, when the signal processing module 206 receives the ON pulse signal, the signal processing module 206 latches the ON pulse signal at the high voltage level. When the signal processing module 206 receives the OFF pulse signal, the signal processing module 206 latches the OFF pulse signal at the low voltage level. Hence, the signal processing module 206 can generate a driving signal having the high voltage level and the low voltage level by latching the ON pulse signal and the OFF pulse signal. The signal processing module 206 then outputs the driving signal VE1 having a driving capability after the driving signal is amplified. A rising edge of the driving signal VE1 corresponds to the ON pulse signal. A falling edge of the driving signal VE1 corresponds to the OFF pulse signal.

In the present embodiment, the signal processing module 206 can generate the control signal EN to the short circuit protection circuit 208 and generate the driving signal VE1 to selectively turn on or turn off the semiconductor switch 210 according to the modulating signal PWM so as to adjust the output voltage OUT.

In some embodiments, the signal processing module 206 may be a control chip or a digital signal processor, but the present disclosure is not limited in this regard. In another embodiment, the signal processing module 206 includes a signal processing circuit 206a, an other protection circuit 206b, and a push-pull amplifier circuit 206c. The signal processing circuit 206a is configured to output the driving signal VE1 according to the modulating signal PWM. In greater detail, the signal processing circuit 206a performs signal demodulation according to the ON pulse signal and the OFF pulse signal generated by the primary circuit 202 so as to generate the driving signal VE1 having the high voltage level and the low voltage level. The signal processing circuit 206a may further turn off the semiconductor switch 210 according to a short circuit protection signal VP1 outputted by the short circuit protection circuit 208 and a protection signal VP2 outputted by the other protection circuit 206b so as to provide a short circuit protection and various types of protections to the semiconductor switch 210.

In various embodiments, the other protection circuit 206b includes an over-current protection circuit, an over-voltage protection circuit, an over-temperature protection circuit, or other type of protection circuit. The push-pull amplifier circuit 206c is configured to improve the driving capability of the driving signal VE1 so as to drive the semiconductor switch 210. In other words, the push-pull amplifier circuit 206c can amplify the driving signal VE1 having the high voltage level and the low voltage level so that it is sufficient to drive the semiconductor switch 210.

The short circuit protection circuit 208 is electrically coupled to the semiconductor switch 210 and is configured to generate the above-mentioned short circuit protection signal VP1 according to the control signal EN and a short circuit status of the semiconductor switch 210. Hence, when the semiconductor switch 210 works in a short circuit condition, the signal processing module 206 turns off the semiconductor switch 210 according to the short circuit protection signal VP1 so as to improve the reliability of the semiconductor switch 210.

In the following paragraphs of the present disclosure, several embodiments being able to realize the above-mentioned functions and operations of the above-mentioned short circuit protection circuit 208 are provided. In the various embodiments described as follows, the semiconductor switch 210 is an insulated gate bipolar transistor (IGBT) as illustration, but the present disclosure is not limited to the following embodiments.

Figure 3A:
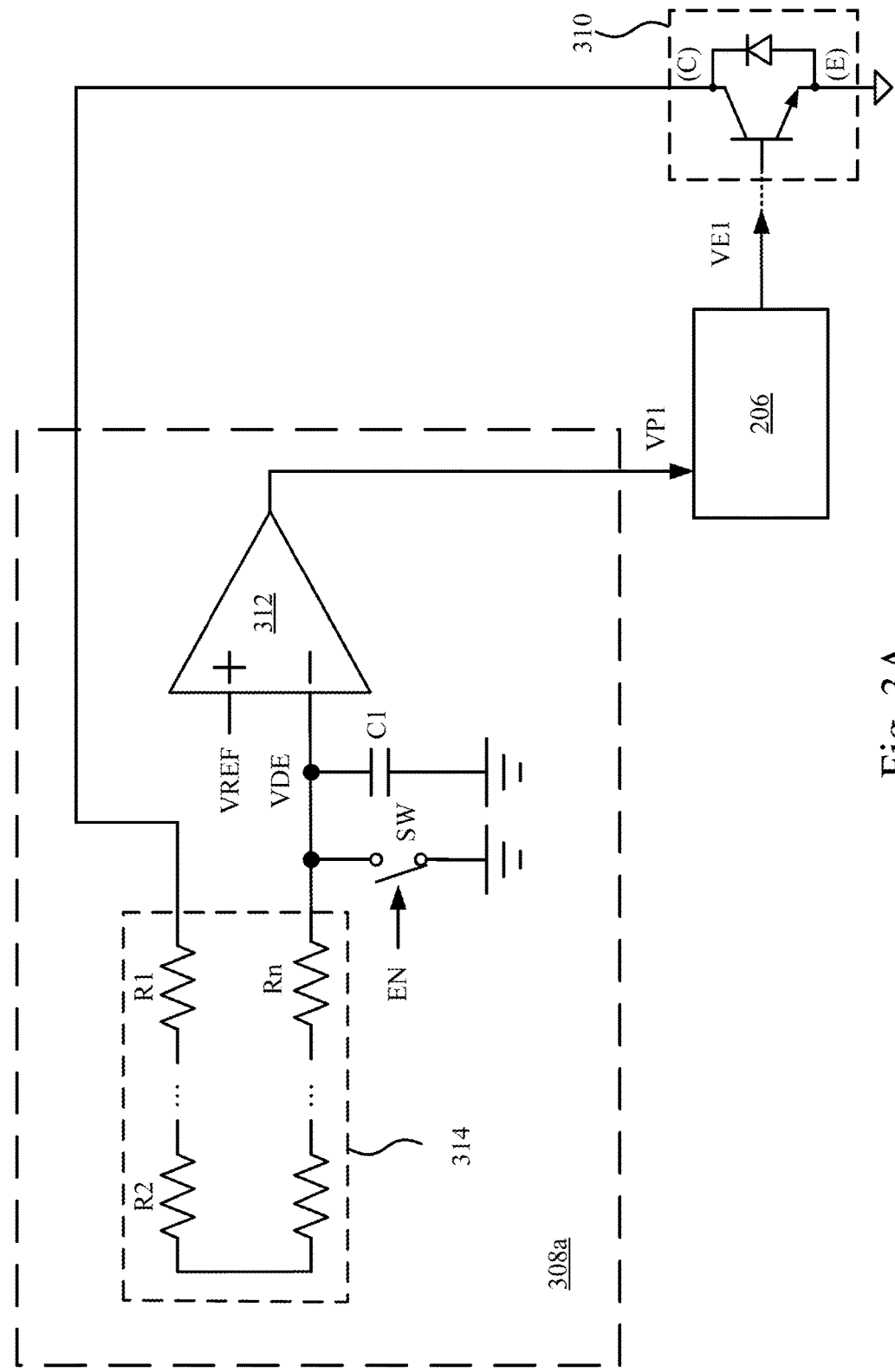
FIG. 3A depicts a schematic diagram of a short circuit protection circuit according to one embodiment of this disclosure.

FIG. 3A depicts a schematic diagram of a short circuit protection circuit 308a according to one embodiment of this disclosure. As shown in FIG. 3A, the short circuit protection circuit 308a includes a capacitor C1, a comparator 312, a switch SW, and a sampling circuit 314. In the present embodiment, the switch SW may be a triode or a MOSFET. The capacitor C1 may be electrically coupled to a collector (C) of an IGBT 310 via the sampling circuit 314 so that the capacitor C1 is charged by a voltage at the collector (C) to generate a detecting voltage VDE. The comparator 312 is electrically coupled to the capacitor C1 and configured to compare the detecting voltage VDE with a reference voltage VREF to generate the short circuit protection signal VP1. The switch SW is electrically coupled to the capacitor C1 in parallel and is selectively turned on or turned off according to the control signal EN. When the switch SW is turned on, the capacitor C1 is allowed to discharge so that a voltage of the capacitor C1 is pulled to zero. The sampling circuit 314 includes a plurality of resistors R1-Rn coupled in series, in parallel, or in a series-parallel manner, but the present disclosure is not limited in this regard. The sampling circuit 314 may be various types of voltage sensing circuits. When the switch SW is turned off, the voltage at the collector (C) of the IGBT 310 can charge the capacitor C1 via the plurality of resistors R1-Rn coupled in series.

As mentioned previously, when the power converter 200 works in a short circuit condition, a voltage VCE between the collector (C) and an emitter (E) of the IGBT 310 will rise and charge the capacitor C1 via the plurality of resistors R1-Rn electrically coupled in series. When a short circuit occurs, the detecting voltage VDE on the capacitor C1 is charged to be higher than the reference voltage VREF. The comparator 312 thus changes the status of the short circuit protection signal VP1 to turn off the IGBT 310.

Or, in other embodiments, the above capacitor C1 may be a parasitic capacitor of the switch SW. In other words, the parasitic capacitor of the switch SW may also be charged by the voltage at the collector (C) of the IGBT 310 to generate the detecting voltage VDE so as to accomplish the short circuit protection same as above.

Figure 3B:
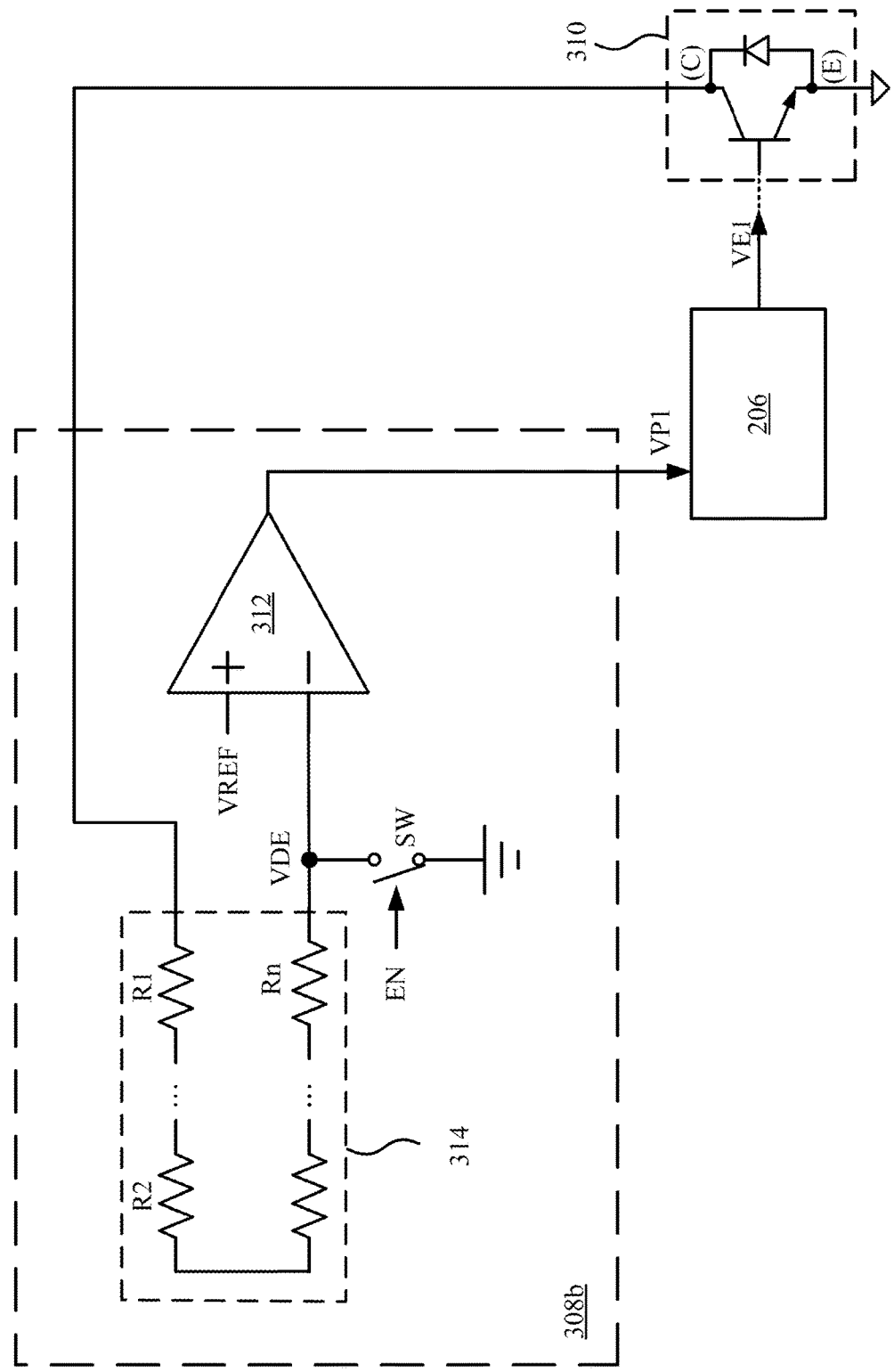
FIG. 3B depicts a schematic diagram of a short circuit protection circuit 308b according to another embodiment of this disclosure.

FIG. 3B depicts a schematic diagram of a short circuit protection circuit 308b according to another embodiment of this disclosure. As compared with the above-mentioned short circuit protection circuit 308a, the short circuit protection circuit 308b in FIG. 3B can operate without an extra capacitor or a parasitic capacitor.

In greater detail, in the present embodiment, the switch SW is electrically coupled to the comparator 312. The sampling circuit 314 can detect the voltage at the collector (C) of the IGBT 310 to directly generate the detecting voltage VDE to the comparator 312. The comparator 312 is configured to receive the detecting voltage VDE and the reference voltage VREF and compare the detecting voltage VDE with the reference voltage VREF when the switch SW is turned off. When the detecting voltage VDE is higher than the reference voltage VREF (that is, the IGBT 310 works in a short circuit condition), the comparator 312 changes the status of the short circuit protection signal VP1 to turn off the IGBT 310. When the switch SW1 is turned on, the detecting voltage VDE is pulled to ground via the switch SW. At this time, the comparator 312 will keep the status of the short circuit protection signal VP1 to allow the IGBT 310 to operate normally. In various embodiments, the reference voltage VREF can be adjusted based on different arrangements.

Figure 3C:
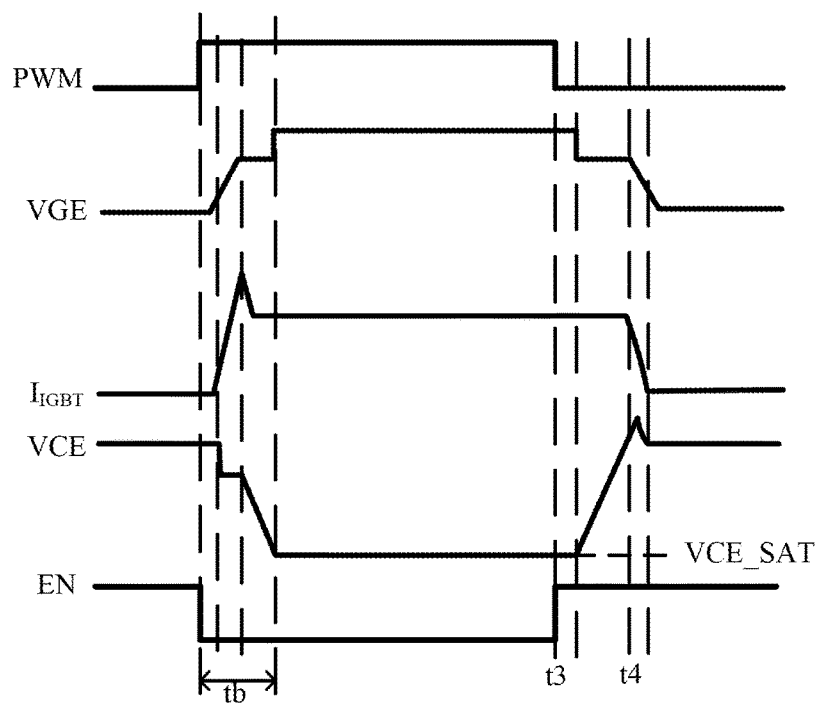
FIG. 3C depicts an operation waveform of the short circuit protection circuit in FIG. 3A according to one embodiment of this disclosure.

FIG. 3C depicts an operation waveform of the short circuit protection circuit in FIG. 3A according to one embodiment of this disclosure. For simplify illustration, a description is provided as follows with reference to the short circuit protection circuit 308a shown in FIG. 3A, however the relevant operations and illustration are able to be applied to the embodiment shown in FIG. 3B. As shown in FIG. 3C, when the IGBT 310 is turned off normally (i.e., time t3), the above-mentioned voltage VCE will also rise (i.e., time t4). At this time, the short circuit protection circuit 308a may possibly misjudge that a short circuit occurs, and thus turn off the IGBT 310.

Therefore, according to the present embodiment, the short circuit protection circuit 308a can turn on the switch SW to allow the capacitor C1 to discharge. As a result, the detecting voltage VDE is pulled down so as to avoid that the IGBT 310 is turned off incorrectly.

In one embodiment, a phase of the driving signal VE1 and a phase of the modulating signal PWM may be set to be the same under normal operation. A phase of the control signal EN and the phase of the modulating signal PWM may be set to be opposite to each other. It is noted that, according to the present embodiment, the phase of the driving signal VE1 and the phase of the modulating signal PWM are set to be the same refers to that the driving signal VE1 is also at the high voltage level when the modulating signal PWM is at the high voltage level and the driving signal VE1 is also at the low voltage level when the modulating signal PWM is at the low voltage level. Likewise, that the phase of the control signal EN and the phase of the modulating signal PWM are set to be opposite to each other refers to that the control signal EN is at the low voltage level when the modulating signal PWM is at the high voltage level and the control signal EN is at the high voltage level when the modulating signal PWM is at the low voltage level. In this manner, under normal operation, when the IGBT 310 is turned on, the switch SW will be turned off by the control signal EN to allow the capacitor C1 to be charged by the voltage VCE correctly. Conversely, when the IGBT 310 is turned off, the switch SW will be turned on by the control signal EN. At this time, the capacitor C1 can discharge via the switch SW to lower a voltage level of the detecting voltage VDE to zero, thus avoiding that the operational status of the IGBT 310 is changed incorrectly.

However, due to the delay of signal transmission and device characteristics of the IGBT 310, a voltage VGE will gradually rise and the voltage VCE will drop slowly to a saturation voltage VCE_SAT during the turning on of the IGBT 310. During a delay duration (such as the delay duration tb shown in FIG. 3C) between a time at the rising edge of the modulating signal PWM and a time at which the voltage VCE between the collector (C) and the emitter (E) of the IGBT 310 drops to the saturation voltage VCE_SAT of the IGBT 310, the short circuit protection circuit 308a will still possibly misjudge that the power converter 200 works in a short circuit condition and change the operational status of the IGBT 310 incorrectly.

Figure 3D:
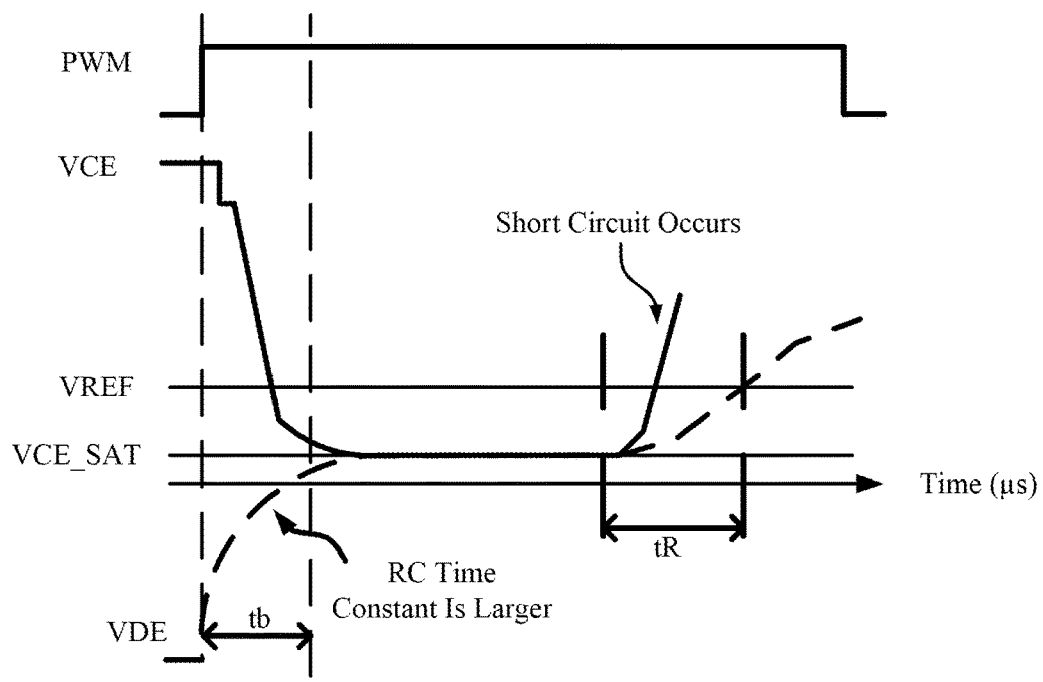
FIG. 3D depicts an operation waveform of the short circuit protection circuit in FIG. 3A with an increased RC time constant according to one embodiment of this disclosure.

FIG. 3D depicts an operation waveform of the short circuit protection circuit 308a in FIG. 3A with an increased RC time constant according to one embodiment of this disclosure. As compared with the embodiment shown in FIG. 3C, resistance values of the plurality of resistors R1-Rn or a capacitance value of the capacitor C1 in the sampling circuit 314 can be increased to increase the RC time constant when the voltage VCE charges the capacitor C1 in consideration of the influence of the above-mentioned delay duration tb, as shown in FIG. 3D. Hence, during the delay duration tb, the detecting voltage VDE only rises to a voltage level lower than the reference voltage VREF to avoid turning off the IGBT 310 incorrectly.

However, when the power converter 200 works in a short circuit condition, the reaction time of the short circuit protection circuit 308a to turn off the IGBT 310 is affected if the RC time constant is too large. As shown in the embodiment in FIG. 3D, when a short circuit occurs, the rise time of the detecting voltage VDE becomes longer because the charge speed of the capacitor C1 becomes slower. The time that the IGBT 310 needs to sustain a current and a high voltage in short circuit condition is elongated by a time tR, thus reducing the reliability of the IGBT 310.

A description is provided with reference to the embodiment in FIG. 3C and the embodiment in FIG. 3D. In order to avoid the problems caused by the above-mentioned time tb and time tR, in these embodiments, the delay duration tb is further present between the modulating signal PWM and the control signal EN. The semiconductor switch 210 is turned on during the delay duration tb. The short circuit protection circuit 308a can keep the operational status of the IGBT 310 according to the control signal EN during the delay duration tb so as to avoid that the IGBT 310 is misjudged to be in a short circuit condition. In these embodiments, the delay duration tb is the time interval between the time at the rising edge of the modulating signal PWM and the time at which the voltage VCE between the collector (C) and the emitter (E) of the IGBT 310 drops to the saturation voltage VCE_SAT of the IGBT 310.

Figure 4A:
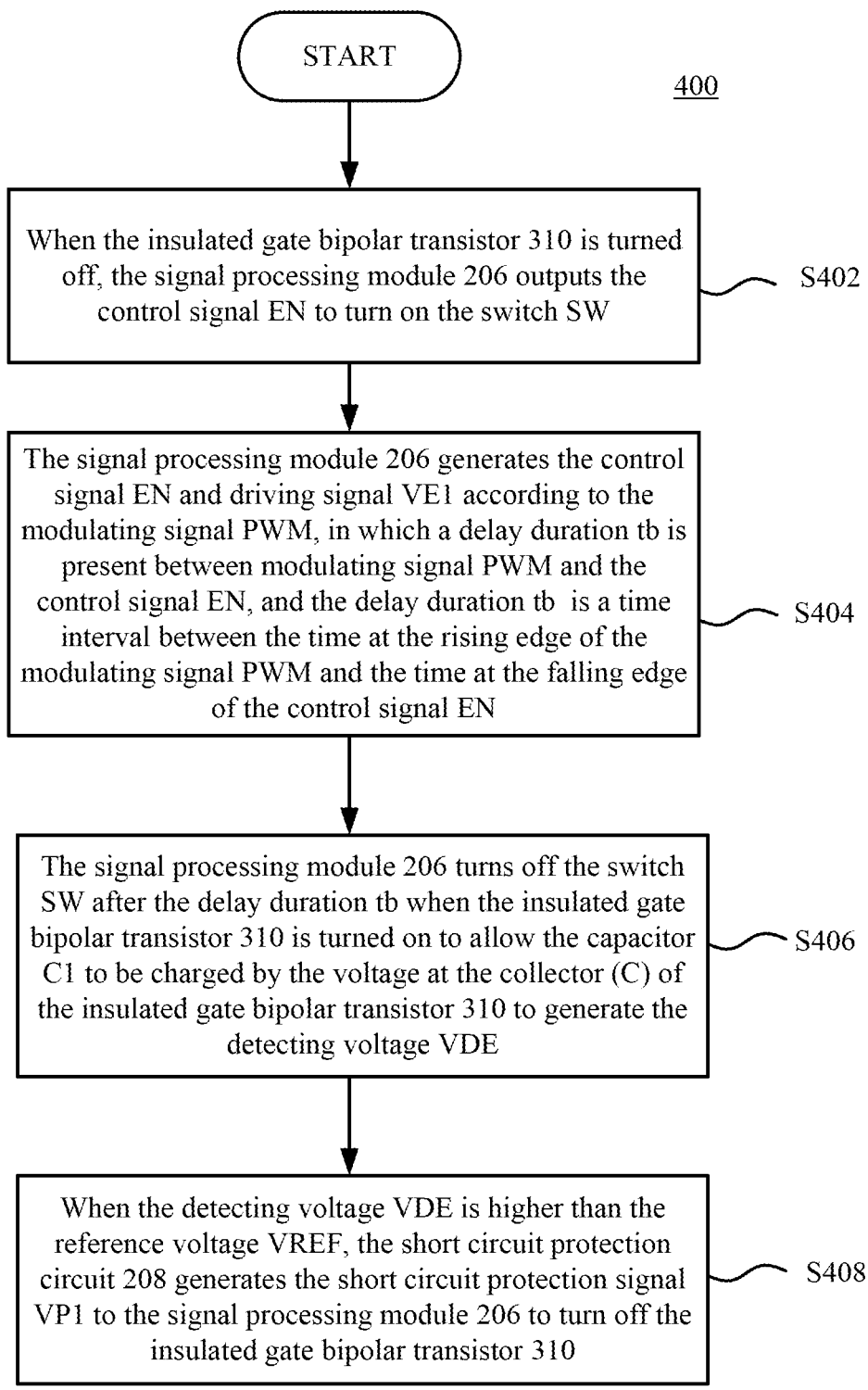
FIG. 4A depicts a flow chart of a control method according to still another embodiment of this disclosure.
Figure 4B:
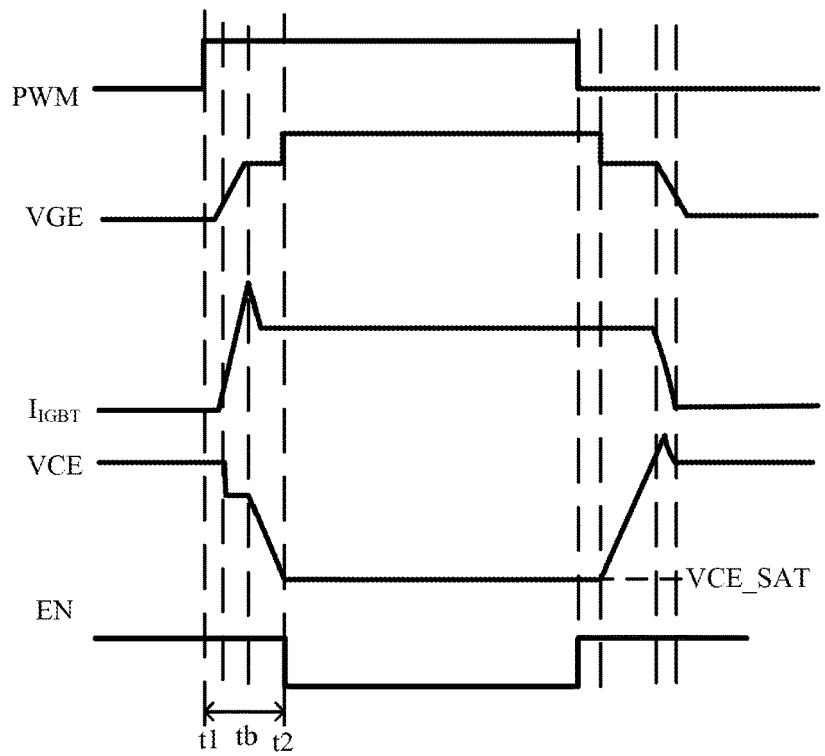
FIG. 4B depicts an operation waveform of the short circuit protection circuit in FIG. 3A according to the embodiment shown in FIG. 4A.

FIG. 4A depicts a flow chart of a control method 400 according to still another embodiment of this disclosure. FIG. 4B depicts an operation waveform of the short circuit protection circuit in FIG. 3A according to the embodiment shown in FIG. 4A. To simplify matters, a description is provided as follows with reference to FIG. 3A, FIG. 4A, and FIG. 4B. The control method 400 is explained together with operations of the short circuit protection circuit 308a.

As shown in FIG. 4B, in order to avoid the problems caused by the above-mentioned time tb and time tR, the above-mentioned delay duration tb is further present between the time at the rising edge (for example: time t1) of the modulating signal PWM and the time at the falling edge (for example: time t2) of the control signal EN according to the present embodiment. Thus, when the IGBT 310 is turned on, the short circuit protection circuit 308a can keep the operational status of the IGBT 310 according to the control signal EN during the delay duration tb so as to avoid that the IGBT 310 is misjudged to be in a short circuit condition.

A description is provided with reference to FIG. 2, FIG. 3A, and FIG. 4A to FIG. 4C. The control method 400 includes step S402, step S404, step S406, and step S408. In step S402, when the IGBT 310 is turned off, the signal processing module 206 outputs the control signal EN to turn on the switch SW. Since the IGBT 310 does not need the short circuit protection provided by the short circuit protection circuit 208 when it is turned off, at this time the switch SW can be turned on to reset the voltage of the capacitor C1 to zero, so as to ensure that the short circuit protection circuit 208 does not act.

In step S404, the signal processing module 206 generates the above-mentioned control signal EN and driving signal VE1 according to the modulating signal PWM. The delay duration tb is configured to present between the modulating signal PWM and the control signal EN, in which the delay duration tb is a time interval between the time at the rising edge (such as the time t1 in FIG. 4B) of the modulating signal PWM and the time at the falling edge (such as the time t2 in FIG. 4B) of the control signal EN. In greater detail, when it is the time at the rising edge (i.e., time t1) of the modulating signal PWM and when the modulating signal PWM is at the high voltage level, the IGBT 310 is tuned on. Conversely, when it is the time at the falling edge of the modulating signal PWM and when the modulating signal PWM is at the low voltage level, the IGBT 310 is turned off.

Furthermore, when the modulating signal PWM is at the high voltage level, the switch SW is turned on during the delay duration tb and is turned off after the delay duration tb. When the modulating signal PWM is at the low voltage level, the switch SW is kept on. Therefore, the voltage of the capacitor C1 (that is, the detecting voltage VDE) can be kept at zero during the delay duration tb by controlling the switch SW to prevent the short circuit protection circuit 208 from acting. In addition, the capacitor C1 can be charged by the voltage at the collector (C) of the IGBT 310 after the delay duration tb so as to detect the short circuit status of the IGBT 310 correctly.

In step S406, the signal processing module 206 can turn off the switch SW after the delay duration tb when the IGBT 310 is turned on. The capacitor C1 is thus charged by the voltage at the collector (C) of the IGBT 310 to generate the detecting voltage VDE. For example, as shown in FIG. 3A, the IGBT 310 can charge the capacitor C1 via the sampling circuit 314 and generate the detecting voltage VDE to the comparator 312.

In step S408, when the detecting voltage VDE is higher than the reference voltage VREF (that is, the IGBT 310 works in a short-circuit condition), the short circuit protection circuit 208 generates the short circuit protection signal VP1 to the signal processing module 206 to turn off the IGBT 310.

As compared with the embodiment in FIG. 3C or FIG. 3D, as shown in FIG. 4B, the delay duration tb is the time interval between the time at the rising edge (that is time t1) of the modulating signal PWM and the time at the falling edge (that is time t2) of the control signal EN according to the present embodiment. Therefore, the switch SW is turned on either when the IGBT 310 is turned off or during the delay duration tb. The capacitor C1 thus discharges to maintain the operational status of the IGBT 310. Hence, in order to avoid the incorrect operation of the short circuit protection circuit 308a, there is no need to increase the RC time constant of the sampling module 314. As a result, the capacitor C1 can be charged by the voltage VCE rapidly when the IGBT 310 works in a short circuit condition.

In practice, the delay duration tb can be acquired from specification of the IGBT 310 or by measurements in advance. Then, the above-mentioned delay duration tb is set to the control signal EN by the signal processing module 206. In various embodiments, the above delay duration tb may be an adjustable numerical value. For example, those of ordinary skill in the art is able to adjust the delay duration tb depending on the device characteristics of the selected semiconductor switch (for example: the IGBT 310).

Figure 4C:
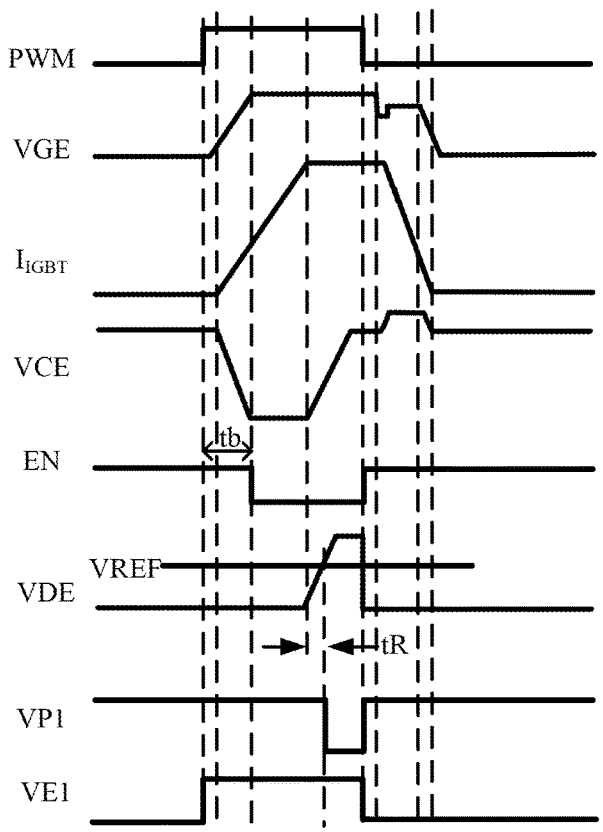
FIG. 4C depicts an operation waveform when a power converter works in a short circuit condition according to the embodiment shown in FIG. 4B.

FIG. 4C depicts an operation waveform when the power converter 200 works in a short circuit condition according to the embodiment shown in FIG. 4B. As shown in FIG. 4C, when a short circuit occurs, the detecting voltage VDE can be charged to be higher than the reference voltage VREF in quite a short period of time to allow the comparator 312 to change the status of the short circuit protection signal VP1. For example, the short circuit protection signal VP1 changes from the high voltage level to the low voltage level to turn off the IGBT 310.

As compared with the embodiment in FIG. 3C, the present embodiment shortens the time that the IGBT 310 needs to sustain the high current and the high voltage in the short circuit condition. Additionally, in the present embodiment, noises incurred when the IGBT 310 is turned on can be filtered by the switch SW, thus improving the reliability and noise immunity of the short circuit protection circuit 308a.

Figure 5A:
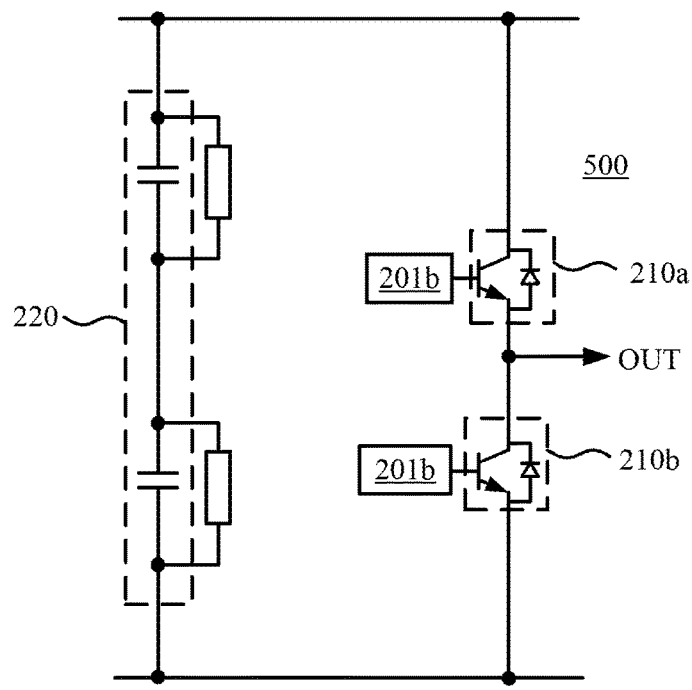
FIG. 5A depicts a schematic diagram of a dual-level bridge arm according to one embodiment of this disclosure.
Figure 5B:
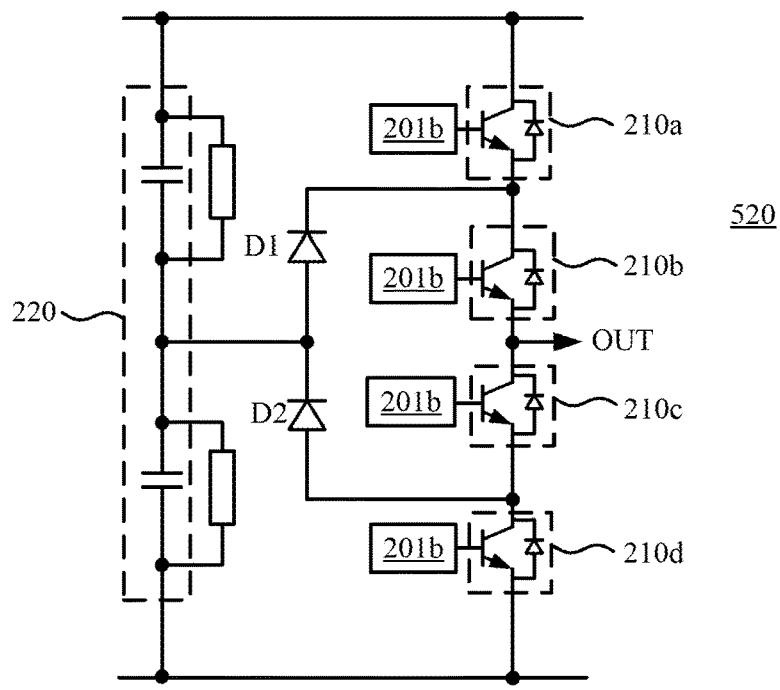
FIG. 5B depicts a schematic diagram of a three-level bridge arm according to another embodiment of this disclosure.

The above-mentioned embodiments are only illustrative. The short circuit protection circuit 308a and the control method 400 of the present disclosure may also be applied to the power converter having a plurality of semiconductor switches 210 coupled in series or in parallel or a multi-level bridge arm. FIG. 5A depicts a schematic diagram of a dual-level bridge arm 500 according to one embodiment of this disclosure. FIG. 5B depicts a schematic diagram of a three-level bridge arm 520 according to another embodiment of this disclosure.

In one embodiment, the above-mentioned driver 201b may be applied to the power converter having the dual-level bridge arm 500 as shown in FIG. 5A. Or, in another embodiment, the short circuit protection circuit 308a may also be applied to the power converter having the three-level bridge arm 520 as shown in FIG. 5B.

For example, as shown in FIG. 5A, the dual-level bridge arm 500 includes a bus capacitor module 220, a first semiconductor switch 210a, a second semiconductor switch 210b, and drivers 201b. A first terminal (for example: a collector (C)) of the first semiconductor switch 210a is electrically coupled to one terminal of the bus capacitor module 220. A second terminal (for example: an emitter (E)) of the first semiconductor switch 210a is configured to generate an output voltage OUT. A control terminal (for example: a gate (G)) of the first semiconductor switch 210a is electrically coupled to a corresponding driver 201b so as to be controlled by the driver 201b. Likewise, a first terminal of the second semiconductor switch 210b is electrically coupled to the second terminal of the first semiconductor switch 210a. A second terminal of the second semiconductor switch 210b is electrically coupled to another terminal of the bus capacitor module 220. A control terminal of the second semiconductor switch 210b is also electrically coupled to a corresponding driver 201b so as to be controlled by the driver 201b.

Alternatively, as shown in FIG. 5B, the three-level bridge arm 520 includes the bus capacitor module 220, the first semiconductor switch 210a, the second semiconductor switch 210b, a third semiconductor switch 210c, a fourth semiconductor switch 210d, diodes D1, D2, and a plurality of drivers 201b.

The first terminal of the first semiconductor switch 210a is electrically coupled to the one terminal of the bus capacitor module 220. The control terminal of the first semiconductor switch 210a is electrically coupled to the corresponding driver 201b. The first terminal of the second semiconductor switch 210b is electrically coupled to the second terminal of the first semiconductor switch 210a. The second terminal of the second semiconductor switch 210b is configured to generate the output voltage OUT. The control terminal of the second semiconductor switch 210b is electrically coupled to the corresponding driver 201b. A first terminal of the third semiconductor switch 210c is electrically coupled to the second terminal of the second semiconductor switch 210b. A control terminal of the third semiconductor switch 210c is electrically coupled to a corresponding driver 201b. A first terminal of the fourth semiconductor switch 210d is electrically coupled to a second terminal of the third semiconductor switch 210c. The second terminal of the fourth semiconductor switch 210d is electrically couple to the another terminal of the bus capacitor module 220. A control terminal of the fourth semiconductor switch 210d is electrically coupled to a corresponding driver 201b. The diode D1 and the diode D2 are coupled in series and electrically coupled between the first terminal of the second semiconductor switch 210b and the first terminal of the fourth semiconductor switch 210d.

In the dual-level bridge arm 500 or the three-level bridge arm 520, each of the semiconductor switches has the corresponding driver 201b to respectively detect the short circuit status of the corresponding semiconductor switch. As a result, the bridge arm structure having a plurality of semiconductor switches can have a complete short circuit protection mechanism.

In addition, a description is provided with reference to FIG. 2 and FIG. 5A. Take the dual-level bridge arm 500 for example, when any of the semiconductor switches 210a-210b (for example: the second semiconductor switch 210b) in the same bridge arm works in a short circuit condition, the signal processing module 206 in the corresponding driver 201b can return the short circuit protection signal VP1 to the control module 201a according to the embodiments of the present disclosure. The control module 201a is thus allowed to send a shutdown signal to the driver 201b corresponding to another semiconductor switch 210 of the same bridge arm so as to turn off the another semiconductor switch (e.g., the semiconductor switches 210a, 210c, and 210d) of the same bridge arm. At the same time, the control module 201a can also send the shutdown signal to the driver 201b corresponding to the semiconductor switch in another bridge arm so as to turn off another semiconductor switch in another bridge arm. Hence, in the application of a multi-level bridge arm, the short circuit protection for each of the first, second, third, and fourth semiconductor switches 210a-210d is more perfect to improve the reliabilities of the first, second, third, and fourth semiconductor switches 210a-210d.

In summary, the power converter, short circuit protection circuit, and control method according to the present disclosure can shorten time that the semiconductor switch sustains high current and the high voltage in the short circuit condition by setting the delay duration to the driver and performing the short circuit protection. As a result, the reliabilities of the power converter and the semiconductor switch are improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A power converter configured to generate an output voltage comprising:
a semiconductor switch configured to adjust the output voltage according to a driving signal;
a short circuit protection circuit configured to generate a short circuit protection signal according to a control signal and a short circuit status of the semiconductor switch; and
a signal processing module electrically coupled to the semiconductor switch and the short circuit protection circuit, and configured to generate the control signal and the driving signal according to a modulating signal and to turn off the semiconductor switch according to the short circuit protection signal;
wherein a delay duration is present between the modulating signal and the control signal, and the semiconductor switch is turned on during the delay duration.

2. The power converter of claim 1, wherein the semiconductor switch comprises an insulated gate bipolar transistor, the short circuit protection circuit is electrically coupled to a collector of the insulated gate bipolar transistor, and the signal processing module is electrically coupled to a gate of the insulated gate bipolar transistor.

3. The power converter of claim 2, wherein the delay duration is a time interval between a time at a rising edge of the modulating signal and a time at which a voltage between the collector and an emitter of the insulated gate bipolar transistor drops to a saturation voltage of the insulated gate bipolar transistor.

4. The power converter of claim 2, wherein the delay duration is an adjustable numerical value.

5. The power converter of claim 2, wherein the short circuit protection circuit comprises:
a capacitor configured to be charged by a voltage at the collector of the insulated gate bipolar transistor to generate a detecting voltage;
a comparator configured to compare the detecting voltage with a reference voltage to generate the short circuit protection signal, the detecting voltage being higher than the reference voltage when the insulated gate bipolar transistor works in a short circuit condition; and
a switch electrically coupled to the capacitor in parallel and configured to be turned on or turned off according to the control signal, wherein the capacitor is charged by the voltage at the collector of the insulated gate bipolar transistor when the switch is turned off.

6. The power converter of claim 5, wherein the short circuit protection circuit further comprises:
a sampling circuit electrically coupled between the insulated gate bipolar transistor and the capacitor, and configured to detect the voltage at the collector of the insulated gate bipolar transistor.

7. The power converter of claim 6, wherein the sampling circuit comprises a plurality of resistors electrically coupled in series, in parallel, or in a series-parallel manner.

8. The power converter of claim 2, wherein the short circuit protection circuit comprises:
a switch electrically coupled to the insulated gate bipolar transistor configured to be turned on or turned off according to the control signal, a parasitic capacitor of the switch being charged by a voltage at the collector of the insulated gate bipolar transistor to generate a detecting voltage, wherein the parasitic capacitor is charged by the voltage at the collector of the insulated gate bipolar transistor when the switch is turned off; and
a comparator configured to compare the detecting voltage with a reference voltage to generate the short circuit protection signal, the detecting voltage being higher than the reference voltage when the insulated gate bipolar transistor works in a short circuit condition.

9. The power converter of claim 8, wherein the short circuit protection circuit further comprises:
a sampling circuit electrically coupled between the insulated gate bipolar transistor and the switch, the sampling circuit being configured to detect the voltage at the collector of the insulated gate bipolar transistor.

10. The power converter of claim 2, wherein the short circuit protection circuit comprises:
a comparator configured to receive a detecting voltage and compare the detecting voltage with a reference voltage to generate the short circuit protection signal, the detecting voltage being higher than the reference voltage when the insulated gate bipolar transistor works in a short circuit condition; and
a switch electrically coupled to the comparator and configured to be turned on or turned off according to the control signal, wherein the comparator receives the detecting voltage when the switch is turned off.

11. The power converter of claim 10, wherein the short circuit protection circuit further comprises:
a sampling circuit electrically coupled to the insulated gate bipolar transistor, the comparator, and the switch, and the sampling circuit being configured to detecting a voltage at the collector of the insulated gate bipolar transistor to generate the detecting voltage.

12. The power converter of claim 1, wherein the delay duration is a time interval between a time at a rising edge of the modulating signal and a time at a falling edge of the control signal.

13. The power converter of claim 2, wherein the insulated gate bipolar transistor is turned on when the modulating signal is at a high voltage level, and the insulated gate bipolar transistor is turned off when the modulating signal is at a low voltage level.

14. The power converter of claim 1, wherein the modulating signal is generated by a control module.

15. The power converter of claim 5, wherein the switch is turned on during the delay duration and turned off after the delay duration when the modulating signal is at a high voltage level.

16. The power converter of claim 8, wherein the switch is turned on during the delay duration and turned off after the delay duration when the modulating signal is at a high voltage level.

17. The power converter of claim 10, wherein the switch is turned on during the delay duration and turned off after the delay duration when the modulating signal is at a high voltage level.

18. The power converter of claim 5, wherein the switch is turned on when the modulating signal is at a low voltage level.

19. The power converter of claim 8, wherein the switch is turned on when the modulating signal is at a low voltage level.

20. The power converter of claim 10, wherein the switch is turned on when the modulating signal is at a low voltage level.

21. The power converter of claim 1, further comprising at least one bridge arm, and the semiconductor switch being disposed in the at least one bridge arm.

22. A short circuit protection circuit configured to generate a short circuit protection signal so as to turn off an insulated gate bipolar transistor when the insulated gate bipolar transistor works in a short circuit condition, the insulated gate bipolar transistor being driven by a driving signal generated by a signal processing module, the short circuit protection circuit comprising:
a comparator electrically coupled to the insulated gate bipolar transistor and configured to receive a detecting voltage and compare the detecting voltage with a reference voltage to generate the short circuit protection signal when the detecting voltage is higher than the reference voltage; and
a switch electrically coupled to the comparator and the insulated gate bipolar transistor and configured to receive a control signal and to be turned off according to the control signal to allow the comparator to receive the detecting voltage;
wherein the signal processing module generates the control signal and the driving signal according to a modulating signal and the signal processing module turns off the insulated gate bipolar transistor according to the short circuit protection signal, a delay duration is configured to be present between the modulating signal and the control signal, and the delay duration is a time interval between a time at a rising edge of the modulating signal and a time at a falling edge of the control signal.

23. The short circuit protection circuit of claim 22, wherein the switch is turned on during the delay duration and turned off after the delay duration when the modulating signal is at a high voltage level.

24. The short circuit protection circuit of claim 22, wherein the switch is turned on when the modulating signal is at a low voltage level.

25. The short circuit protection circuit of claim 22, wherein the delay duration is the time interval between the time at a rising edge of the modulating signal and a time at which a voltage between a collector and an emitter of the insulated gate bipolar transistor drops to a saturation voltage of the insulated gate bipolar transistor.

26. The short circuit protection circuit of claim 22, wherein the delay duration is an adjustable numerical value.

27. The short circuit protection circuit of claim 22, further comprising:
a sampling circuit electrically coupled to the insulated gate bipolar transistor, the comparator, and the switch and the sampling circuit being configured to detect a voltage at a collector of the insulated gate bipolar transistor so as to generate the detecting voltage.

28. The short circuit protection circuit of claim 27, wherein the sampling circuit comprises a plurality of resistors electrically coupled in series, in parallel, or in a series-parallel manner.

29. The short circuit protection circuit of claim 22, wherein the insulated gate bipolar transistor is turned on when the modulating signal is at a high voltage level, and the insulated gate bipolar transistor is turned off when the modulating signal is at a low voltage level.

30. The short circuit protection circuit of claim 22, wherein the switch comprises:
a parasitic capacitor configured to be charged by a voltage at a collector of the insulated gate bipolar transistor to generate the detecting voltage.

31. The short circuit protection circuit of claim 22, further comprising:
a capacitor electrically coupled to the switch and the comparator, and configured to be charged by a voltage at a collector of the insulated gate bipolar transistor to generate the detecting voltage.

32. A control method adapted for an insulated gate bipolar transistor, the insulated gate bipolar transistor being turned on or turned off according to a driving signal, the control method comprising:
turning on a switch by a control signal when the insulated gate bipolar transistor is turned off, the switch being electrically coupled to a comparator and the comparator being electrically coupled to a collector of the insulated gate bipolar transistor;
generating the control signal and the driving signal according to a modulating signal by a signal processing module, wherein a delay duration is configured to be present between the modulating signal and the control signal, and the delay duration is a time interval between a time at a rising edge of the modulating signal and a time at a falling edge of the control signal;
turning off the switch after the delay duration to allow the comparator to receive a detecting voltage when the insulated gate bipolar transistor is turned on; and generating a short circuit protection signal to the signal processing module to turn off the insulated gate bipolar transistor when the detecting voltage is higher than a reference voltage.

33. The control method of claim 32, wherein the step of generating the detecting voltage comprises:
detecting a voltage at the collector of the insulated gate bipolar transistor by a sampling circuit to generate the detecting voltage.

34. The control method of claim 32, wherein the step of generating the detecting voltage comprises:
generating the detecting voltage by a capacitor, the capacitor being electrically coupled to the insulated gate bipolar transistor, the switch, and the comparator, wherein the capacitor is charged by a voltage at the collector of the insulated gate bipolar transistor when the switch is turned off.

35. The control method of claim 32, wherein the step of generating the detecting voltage comprises:
generating the detecting voltage by a parasitic capacitor of the switch, wherein the parasitic capacitor is charged by a voltage at the collector of the insulated gate bipolar transistor when the switch is turned off.

36. The control method of claim 32, wherein the switch is turned on during the delay duration and turned off after the delay duration when the modulating signal is at a high voltage level.

37. The control method of claim 32, wherein the switch is turned on when the modulating signal is at a low voltage level.

38. The control method of claim 37, wherein the detecting voltage is zero when the switch is turned on.

39. The control method of claim 32, wherein the delay duration is the time interval between the time at a rising edge of the modulating signal and a time at which a voltage between the collector and an emitter of the insulated gate bipolar transistor drops to a saturation voltage of the insulated gate bipolar transistor.

40. The control method of claim 32, wherein the insulated gate bipolar transistor is turned on when the modulating signal is at a high voltage level, and the insulated gate bipolar transistor is turned off when the modulating signal is at a low voltage level.

41. The control method of claim 32, further comprising:
outputting the modulating signal by a control module.

42. The control method of claim 41, wherein the insulated gate bipolar transistor is disposed in at least one bridge arm of a power converter, the control method further comprises:
transmitting the short circuit protection signal to the control module; and
outputting a shutdown signal by the control module to turn off another insulated gate bipolar transistor in the at least one bridge arm.

* * * * *